_United States Patent_ [19]

Blum et al.

[11] 4,131,530

[45] Dec. 26, 1978

[54] SPUTTERED CHROMIUM-ALLOY COATING FOR PLASTIC

[75] Inventors: Peter Blum, North Plainfield, N.J.; Richard A. Lucariello, Walnut Creek, Calif.

[73] Assignee: Airco, Inc., Montvale, N.J.

[21] Appl. No.: 812,962

[22] Filed: Jul. 5, 1977

[51] Int. Cl.$^2$ .......................... C23C 15/00; B32B 15/04
[52] U.S. Cl. ................................ 204/192 C; 428/457; 428/462
[58] Field of Search ........... 204/192 C, 192 M, 192 P, 204/298; 428/457, 461, 462; 427/250

[56] References Cited

U.S. PATENT DOCUMENTS

| | | | |
|---|---|---|---|
| 2,993,806 | 7/1961 | Fisher et al. ................. | 204/192 C X |
| 4,022,947 | 5/1977 | Grubb ........................... | 428/432 |
| 4,028,206 | 6/1977 | King ............................. | 204/192 C |

FOREIGN PATENT DOCUMENTS 264102  6/1970  U.S.S.R. .............................. 204/192 C

OTHER PUBLICATIONS

W. Slusark, et al. "Structure & Electrical Conductivity of Cosputtered Gold–Chromium Alloy Films," _J. Appl. Phys._, vol. 44, pp. 2891–2892 (1973).
J. A. Thornton et al, "Internal Stresses in Titanium, Nickel, Molybdenum, and Tantalum Films Deposited by Cylindrical Magnetron Sputtering, " _J. Vac. Sci. Tech.,_ vol. 14, pp.164–168 (1977).
N. Hosokawa et al, Self-Sputtering Phenomena in High-Rate Coaxial Cylindrical Magnetron Sputtering," _J. Vac. Sci. Tech.,_ vol. 14, pp. 143–146 (1977).
J. A. Thornton, "Sputter Deposition Onto Plastics," _Proc. 18th Ann. Conf. of Society of Vacuum Coaters,_ Key Biscayne, Fla., Apr. 7-9, 1975, pp. 8-26.
J. S. Chapin, "The Planar Magnetron," _Research Development,_ vol. 25, pp. 37-40 (1974).
N. E. Ryan, "An Appraisal of Possible Scavenger Elements for Chromium and Chromium Alloys," _J. Less Common Metals,_ vol. 6, pp. 21-35 (1964).
F. Henderson et al., "The Effect of Nitride-Formers Upon the Ductile-Brittle Transition in Chromium," _J. Inst. Metals,_ vol. 92, pp. 111-117 (1963-1964).

_Primary Examiner_—John H. Mack
_Assistant Examiner_—Aaron Weisstuch
_Attorney, Agent, or Firm_—David A. Draegert; Larry R. Cassett; Edmund W. Bopp

[57] ABSTRACT

A sputtering method and target for depositing a crack-resistant metal coating on plastic is described. The target consists essentially of Cr, 5 to 30% Fe and 0 to 5% scavenger elements. Al, Ce, La, Ti and Zr, among others, are preferred scavengers. ABS plastic is a preferred substrate. The coated articles have the appearance of bright chromium metal, and are useful as automotive trim.

18 Claims, 3 Drawing Figures

SPUTTERED CHROMIUM-ALLOY COATING FOR PLASTIC

BACKGROUND OF THE INVENTION

The invention is in the field of metal-coated plastic articles, and sputtering processes for manufacturing such products.

There are many applications for plastic parts which have the appearance of bright metal. One particular example, is the automotive field where the need for greater fuel economy requires the replacement of metal parts with lighter weight plastic. Metal parts having a chromium coating are a tradition in the automotive industry because of their bright appearance and resistance to abrasion, corrosion and other deleterious environmental effects. Several methods for depositing chromium coatings onto plastic have been developed. These methods have various shortcomings, and most of the resulting articles are unsatisfactory for use as exterior trim on an automobile because they are unable to withstand continual exposure to water and sunlight for a useful lifetime.

In a paper entitled "Sputter Deposition Onto Plastics", in the Proceedings of the 18th-Annual Conference of the Society of Vacuum Coaters (Key Biscayne, Fla., Apr. 7-9, 1975), pp. 8-26, John A. Thornton describes a method of depositing 50 to 100 nm thick metal coatings on lacquer covered pieces of ABS plastic by sputtering a chromium target. This paper describes several advantages obtained by magnetically confining the glow discharge plasma. Among these advantages are high deposition rate at low sputtering gas pressure, minimal substrate heating, and excellent adhesion of the coating to the substrate.

The above mentioned paper by Thornton describes a sputtering source in which the glow discharge plasma is confined adjacent a cylindrical post target. In a paper entitled "The Planar Magnetron", Research/Development Vol. 25, No. 1 (January 1974), John S. Chapin describes a sputtering source in which the glow discharge plasma is confined to a closed loop adjacent a substantially planar target. Such confinement is particularly advantageous because a single substrate placed near the target can receive a large fraction of the sputered material, and the target can be easily elongated to accomodate large substrates.

Sputter-deposition of chromium coatings onto plastic substrates presents several difficult problems. First, the high melting point and brittleness of chromium make it difficult to fabricate targets. Second, the reflectance of the coating is a function of sputtering pressure and other process parameters. For example, the above-mentioned paper by Thornton indicates that the reflectance of chromium coatings on plastic decreased from about 62% at a sputtering gas pressure of 1 millitorr (mT) to about 40% at 4 mT. Third, cracking of the metal coating is a major problem. The incidence of cracking extends from a single crack observable only with a microscope to an extensive pattern easily observable with the unaided eye.

The cause of the cracking of the coating is believed to be stresses both within the coating and arising because of differential thermal expansion between the coating and the substrate. Metal coatings on plastic substrates are particularly susceptible to cracking because most organic polymers have relatively high thermal expansion coefficients compared with metals. Cracking is particularly likely with chromium coatings because chromium has relatively low ductility at room temperature compared with many other metals.

It is known that small amounts, less than 1% by weight, of interstitial impurities, notably nitrogen, cause embrittlement of high purity chromium. In a paper, "An Appraisal of Possible Scavenger Elements for Chromium and Chromium Alloys", J. Less-Common Metals, Vol. 6, pp. 21-25 (1964), N. E. Ryan discloses that the presence during melting and casting of a few weight per cent of scavenger elements removes and stabilizes non-metallic interstitial impurities, such as N, O, C and S. The resulting chromium alloy is more ductile at room temperature. The choice of a particular scavenger element depends upon the particular interstitial impurity which is present. For example, Ta reacts with C, Ce and La react with N and O, and Ti and Zr react with N, O and C.

SUMMARY OF THE INVENTION

The invention relates to a product comprising a plastic base and a crack-resistant coating deposited by sputtering a target consisting essentially of chromium, 5 to 30% iron, and 0 to 5% scavenger elements. The base material may be an organic polymer, such as acrylonitrile-butadiene-styrene (ABS), LEXAN polycarbonate, or other plastic. This base may be coated with a suitable organic layer to provide a smooth surface for the deposited metal. Suitable scavenger elements are Al, B, Be, Ce, Hf, La, Nb, Nd, Si, Ta, Th, Ti, U, Y and Zr. In preferred embodiments, the target is 10 to 23% iron and 0.5 to 3% scavenger elements. A composition of about 20% iron, 1.5% Ti, and 0.1% Zr is particularly preferred.

The invention also relates to a method for depositing a crack-resistant coating on a plastic part by placing the part in a chamber containing a sputtering gas, and depositing a coating by sputtering a target consisting essentially of chromium, 5 to 30% iron, and 0 to 5% scavenger elements. Preferably, the sputtering is enhanced by magnetically confining the glow discharge plasma adjacent the target. A planar magnetron source wherein the plasma is confined to a closed loop region adjacent a substantially planar target is even more preferred.

The invention has several advantages. A sputtered alloy coating has much greater resistance to cracking than sputtered chromium films. A sputtered alloy coating obtains high crack resistance and high reflectance over a broader range of process parameters than do sputtered chromium coatings. The sputtered alloy coatings also perform well when exposed to ultraviolet light, high humidity, salt water spray, and other laboratory simulations of deleterious environmental effects.

Because of its lower melting temperature and higher room temperature ductility, the alloy is more easily fabricated into targets by conventional melting, casting, and machining techniques.

DESCRIPTION OF THE PREFERRED EMBODIMENTS

The preferred range for the concentration of iron in the sputtering target is 5 to 30% by weight. A range of 10 to 23% is even more preferred. Several factors are relevant to the choice of a particular composition within these ranges.

The normal melting point of chromium is about 1865 C. The melting point is lowered to 1800 C by the addition of 10% iron, and to 1700 C by the addition of 20% iron. In general, the ease of melting and casting increases as the melting point is lowered. Further, the room temperature ductility generally increases as the concentration of iron increases, and this aids conventional machining operations.

Chromium-iron alloys with greater than about 30% iron are usually found to be strongly ferromagnetic. Experiments indicate that alloys with even 23% iron are slightly magnetic. The presence of strongly magnetic material interferes with magnetically enhanced sputtering. This is particularly true in the typical planar magnetron source where the magnets are on the opposite side of the target from the sputtered surface. In such an arrangement, the lines of magnetic flux must penetrate the target, arc into space adjacent the sputtering surface, and penetrate the target a second time. Further, observation of coatings made by sputtering non-magnetic stainless steels, for example, 18% Cr — 74% Fe — 8% Ni (Type 304 stainless steel), indicate that such coatings have a yellow tint which makes the coatings much less desirable for automotive trim.

The concentration of individual scavenger elements should be sufficient to react with the quantities of N, O, C, S and other non-metallic interstitial impurities present in the starting materials. The choice of particular scavenger elements and their concentrations depends upon the impurity levels in the chromium and other starting materials.

Excessive amounts of scavenger elements promote formation of additional phases which tend to increase the hardness of the alloy. The allowable upper limit for each scavenger element depends upon the particular element. An examination of binary phase diagrams indicates that additional phases in chromium alloys are probably avoided if the concentration of scavenger element is less than 15% for Al, 5% for Ti, and 1% for Zr. It is believed that the total concentration of La, Ce, and other rare earth elements should be less than 1%. Based on experience, the sum of the concentrations of the scavenger elements should not exceed about 5% by weight. A range of 0.5 to 3% is even more preferred.

Figure 1:
FIG. 1 is a cross-sectional view of a sputtering target.

The alloy target is prepared in a conventional manner. The starting materials are vacuum induction melted in a zirconia crucible. Such melting can result in the addition of 0.1% Zr to the melt and this reduces, perhaps to zero, the amount of Zr which should be present in the starting materials before heating. The cast ingots are cut into slices, which are machined into apropriately shaped tiles having a thickness of 0.1 to 1 in. One or more tiles 1 (FIG. 1) are bonded or clamped to a backing plate 2 to form a target having a sputtering surface 3. Targets comprising an alloy layer bonded to a backing plate can also be made by powder metallurgy techniques.

Figure 2:
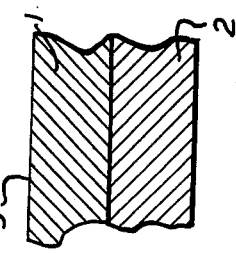
FIG. 2 is a cross-sectional view of a coated article.

A typical substrate is a molded plastic part 4 (FIG. 2), such as an automobile grill or trim part. In order to enhance the appearance, the surface of the part is smoothed by applying a lacquer base coat 5 by flow-coating or spraying and drying in air at 150 to 170 F for about two hours. Typically, the best coat is 10 μm thick. Suitable base coats are commercially available from the Redspot Paint and Varnish Company, Evansville, Ind.

Just prior to coating, the parts are heated to 150 to 170 F for at least 30 minutes to remove absorbed and absorbed water and other volatile materials. The heated parts are mounted on a holder located in a loadlock adjacent to a coating chamber, and the loadlock is closed to the atmosphere.

The sputtering target is attached to a sputtering source which is placed inside the coating chamber. The chamber is first evacuated to a pressure of 0.05 mT and then argon, or other sputtering gas, is introduced to maintain the pressure in the desired range, such as 1 to 5 mT. The loadlock is then opened to the coating chamber, and the parts are moved over the sputtering source at a distance of 4 to 12 in from the target. Typically, the parts pass by the target several times at speeds in the range 2 to 8 in/sec. If desired, the substrates may be rotated as they are translated.

A deposition rate greater than 300 nm/min is preferred. A rate of 400 to 600 nm/min is obtained by applying a dc sputtering current of 50 to 60 A to a planar magnetron source having a 14 × 30 in target. The sputtering power is in the range 20 to 25 kW. Following the coating step, the parts are removed via the loadlock.

The metal coating 6 should be at least 25 nm thick in order to obtain the greatest reflectance, however crack-resistance tends to decrease as the thickness increases. A coating thickness in the range 40 to 140 nm is preferred.

If desired, the metal coated part may be provided with a protective topcoat 7. Suitable acrylic lacquers are commercially available from Bee Chemical Company, Lansing, Ill. Such topcoats are applied by flow-coating or spraying and drying in air at 150 F for about an hour.

Several procedures for measuring the resistance to cracking of metal-coated plastic parts have been developed. In one procedure, a thermocouple or other temperature sensor is embedded in the sample, and the sample is suspended in a region in which air heated by a filament is circulated. The sample is observed with a binocular microscope at 40× while the temperature is increased slowly. The temperature at which cracks are first observed is the crack initiation temperature. A higher crack initiation temperature generally indicates that the sample coating has a greater resistance to cracking. This testing procedure has been found to correlate well with tests of crack-free life at 175 F and other accelerated life tests. A meaningful crack initiation temperature can not be measured in the range above the sofening point of the base plastic. For ABS plastic, the softening temperature is about 230 F.

EXAMPLES

Numerous test panels have been coated under a variety of conditions and tested for crack initiation. In one set of experiments, the test panels were 3×8×0.1 in rectangles of ABS plastic which were annealed by baking 15 hours at 175 F to relieve internal stresses. Use of un-annealed panels results in much greater scatter in the crack initiation temperature data. The panels were coated with a base coat of Redspot EB-1 which is nitrocelulose modified urethane alkyd melamine, metal dryer and acid catalyzed.

The panels were coated in a laboratory system, comprising a planar magnetron sputtering source having a 6 in dia circular target. The sputtering gas was argon at 3 mT pressure, the current was 6 A, and the source to substrate distance was 4 in for all panels.

The composition of six different chromium and chromium alloy targets is indicated in the Table. The composition of the coating itself was not measured, but generally the composition of films deposited by sputtering is quite close to that of the target. The results of crack initiation temperature measurements of panels coated by sputtering the six example targets are given in the FIG. 3.

TABLE

Composition of Chromium and Chromium-Alloy Sputtering Targets

| Example # | Fe (%) | Scavenger (%) | | | |
|---|---|---|---|---|---|
| | | Ti | Zr | Al | MM* |
| 1 | — | — | — | — | — |
| 2 | 11 | 1.2 | 0.1 | 0.5 | 0.1 |
| 3 | 12 | — | — | — | — |
| 4 | 20 | 0.4 | 0.1 | — | — |
| 5 | 20 | 1.5 | 0.4 | 0.3 | 0.1 |
| 6 | 20 | — | 0.1 | — | — |

*Mischmetal, a mixture of rare-earth elements containing about 50% Ce with a remainder of principally La and Nd. The concentration given is approximate because no analysis for rare-earth elements was made.

Figure 3:
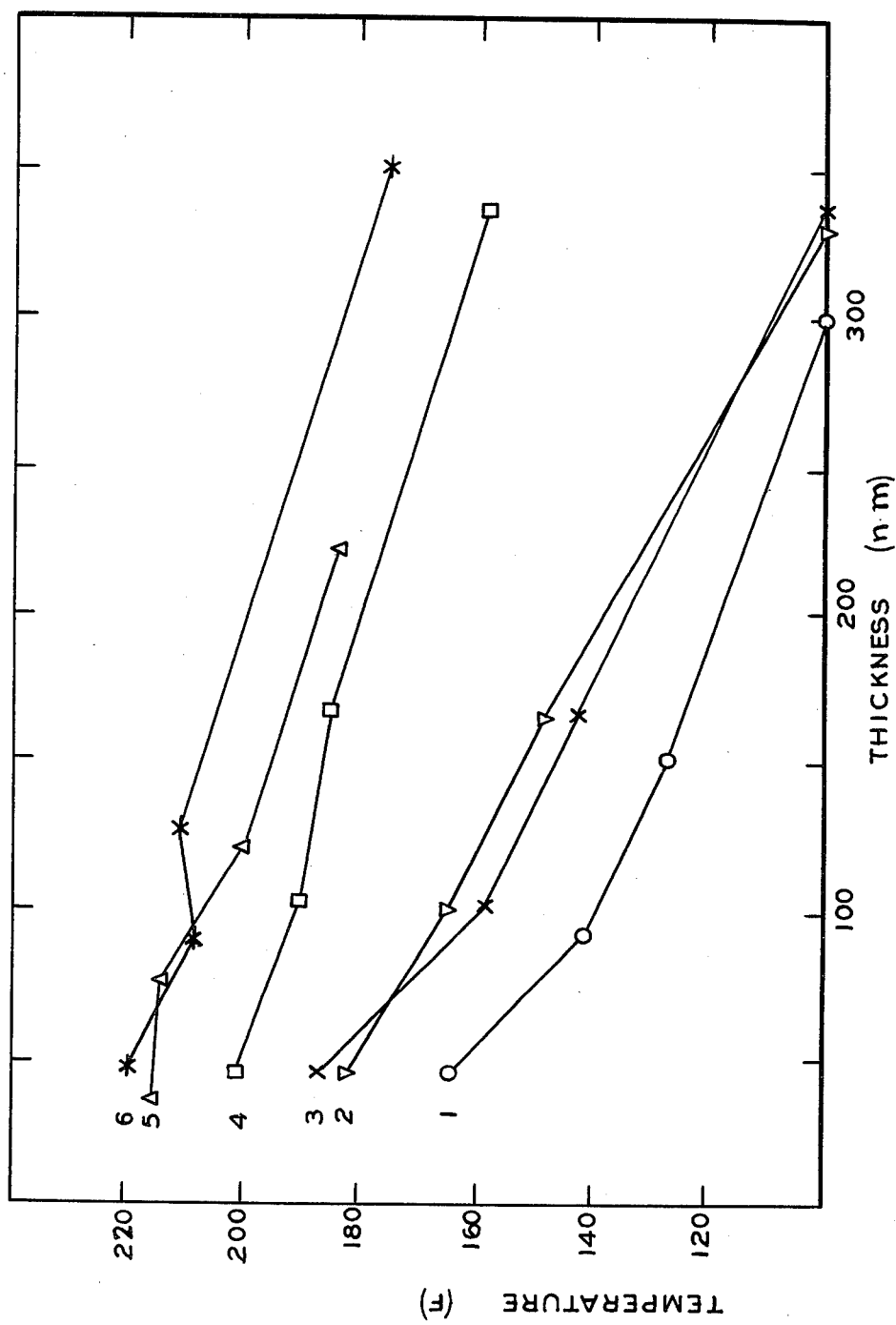
FIG. 3 is a graph which illustrates the crack initiation temperature, a measure of resistance to a crack formation, as a function of thickness for coatings deposited on plastic substrates by sputtering targets of chromium, two chromium-iron alloys, and three chromium-iron-scavenger alloys.

The data of the FIG. 3 indicate that the crack initiation temperature for coatings deposited by sputtering alloy targets (Example 2–6) is higher than that for chromium (Example 1) for all coating thicknesses in the range 50 to 350 nm. The improvement in crack initiation temperature is greater for targets containing 20% Fe than for those containing about 10% Fe. Further, sputtered alloy coatings are more tolerant of changes in various process parameters. Other data for pressures greater than 3 mT indicate that targets containing 20% Fe and scavenger elements produce coatings which have higher crack initiation temperatures than coatings produced by targets containing 20% Fe without significant scavenger elements.

Reflectance data indicate that coatings prepared by depositing material sputtered from targets having a composition similar to that of Example 5 have higher reflectance than sputtered chromium films. Further, the reflectance of the sputtered alloy films decreases at a slower rate with increasing pressure. For example, data for coatings having thicknesses in the range 30 to 200 nm indicate that the average reflectance of Example 5 coatings decreased from 65% to 64% as the pressure increased from 2 to 6 mT while the reflectance of sputtered chromium films decreased from 61% to 58% as the sputtering pressure increased from 2 to 4 mT. Further, data for Example 5 coatings at 2 mT show no significant decrease of reflectance with increasing thickness in the range from 30 to 250 nm, while the reflectance of sputtered chromium coatings decreased 3% as the thickness increased over the same range.

The preceding specific examples and the description of the preferred embodiments are intended to illustrate the invention, but they should not be interpreted to limit the scope of the invention which is defined by the claims.

What is claimed is:

1. An article comprising a plastic base and a crack-resistant metal coating deposited by sputtering a target consisting essentially of 5 to 30% by weight iron, 0 to 5% by weight of scavenger elements, balance chromium.

2. The article according to claim 1 wherein the scavenger elements are selected from the group consisting of Al, B, Be, Ce, Hf, La, Nb, Nd, Si, Ta, Th, Ti, U, Y and Zr.

3. The article according to claim 2 wherein the target contains 10 to 23% iron.

4. The article according to claim 3 wherein the target contains 0.5 to 3% scavenger elements.

5. The article according to claim 4 wherein the base is a plastic material covered with an organic base coat.

6. The article according to claim 5 wherein the plastic material is ABS plastic.

7. The article according to claim 6 wherein the thickness of the sputtered coating is in the range 40 to 140 nm.

8. The article according to claim 7 wherein the article further comprises a topcoat for protecting the metal coating.

9. The article according to claim 8 wherein the target contains about 20% iron, 0.4 to 2% Ti, and 0.1 to 0.4% Zr.

10. A method of depositing a crack-resistant metal coating onto a plastic substrate comprising:
    placing the substrate in a chamber containing a sputtering gas; and
    sputtering a target consisting essentially of 5 to 30% by weight iron, 0 to 5% by weight of scavenger elements, balance chromium to deposit a coating on the substrate.

11. The method according to claim 10 further comprising magnetically confining a glow discharge plasma adjacent the sputtered surface of the target.

12. The method according to claim 11 wherein the sputtering gas pressure is 1 to 5 mT.

13. The method according to claim 12 further comprising heating the substrate just prior to placing the substrates in the chamber.

14. The method according to claim 13 wherein the coating is deposited on the substrate at a rate greater than 300 nm/min.

15. The method according to claim 14 wherein the plasma is confined to a closed loop adjacent a substantially planar target by a planar magnetron sputtering source.

16. The method according to claim 15 wherein the target contains 10 to 23% iron.

17. The method according to claim 16 wherein the target contains 0.5 to 3% scavenger elements.

18. The method according to claim 17 wherein the target contains about 20% iron, 0.4 to 2% Ti, and 0.1 to 0.4% Zr.

* * * * *